(12) United States Patent
Clara et al.

(10) Patent No.: US 9,871,504 B2
(45) Date of Patent: Jan. 16, 2018

(54) DIFFERENTIAL PHASE ADJUSTMENT OF CLOCK INPUT SIGNALS

(71) Applicant: ANALOG DEVICES, INC., Norwood, MA (US)

(72) Inventors: Martin Clara, Newton, MA (US); Gil Engel, Lexington, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/045,059

(22) Filed: Feb. 16, 2016

(65) Prior Publication Data

US 2017/0237419 A1   Aug. 17, 2017

(51) Int. Cl.
*H03K 5/13* (2014.01)
*H03M 1/06* (2006.01)
*H03K 5/00* (2006.01)

(52) U.S. Cl.
CPC ............... *H03K 5/13* (2013.01); *H03M 1/06* (2013.01); *H03K 2005/00286* (2013.01)

(58) Field of Classification Search
CPC .. H03K 5/13; H03K 2005/00286; H03M 1/06
USPC .................................................. 327/100–333
See application file for complete search history.

(56) References Cited

U.S. PATENT DOCUMENTS

| | | | |
|---|---|---|---|
| 5,572,158 A | 11/1996 | Lee et al. | |
| 5,939,916 A | 8/1999 | Jamal et al. | |
| 6,016,422 A | 1/2000 | Bartusiak | |
| 6,118,322 A | 9/2000 | Bockelman et al. | |
| 6,204,784 B1 | 3/2001 | Hatfield | |
| 6,525,577 B2 | 2/2003 | Lee | |
| 6,891,440 B2 | 5/2005 | Straub et al. | |
| 6,900,681 B2 * | 5/2005 | Takano | H03K 5/151 327/163 |
| 7,453,968 B2 | 11/2008 | Chang et al. | |
| 7,555,667 B1 | 6/2009 | Burney et al. | |
| 7,579,890 B2 * | 8/2009 | Sohn | H03K 5/1565 327/172 |
| 8,004,331 B2 | 8/2011 | Li et al. | |

(Continued)

OTHER PUBLICATIONS

Ambert Han-Yuan et al., *Phase Mismatch Detection and Compensation for PPL/DLL Based Multi-Phase Clock Generator*, IEEE 2006 Custom Integrated Circuits Conference (CICC), 1-4244-0076-7/06 © 2006 IEEE, 4 pages.

(Continued)

*Primary Examiner* — Brandon S Cole
(74) *Attorney, Agent, or Firm* — Patent Capital Group

(57) ABSTRACT

Differential clock phase imbalance can produce undesirable spurious content at a digital to analog converter output, or interleaving spurs on an analog-to-digital converter output spectrum, or more generally, in interleaving circuit architectures that depend on rising and falling edges of a differential input clock for triggering digital-to-analog conversion or analog-to-digital conversion. A differential phase adjustment approach measures for the phase imbalance and corrects the differential clock input signals used for generating clock signals which drive the digital-to-analog converter or the analog-to-digital converter. The approach can reduce or eliminate this phase imbalance, thereby reducing detrimental effects due to phase imbalance or differential clock skew.

20 Claims, 7 Drawing Sheets

(56) References Cited

U.S. PATENT DOCUMENTS

| | | | |
|---|---|---|---|
| 8,130,048 B2* | 3/2012 | Kobayashi | H03L 7/0995 327/261 |
| 8,286,022 B2 | 10/2012 | Fung et al. | |
| 8,319,551 B2 | 11/2012 | Muscha | |
| 8,324,949 B2 | 12/2012 | Cherkassky et al. | |
| 8,610,474 B2* | 12/2013 | Aryanfar | G06F 1/10 327/147 |
| 8,749,414 B2* | 6/2014 | Cho | H03M 3/38 341/120 |
| 8,860,475 B1 | 10/2014 | Yeoh et al. | |
| 2009/0267653 A1* | 10/2009 | Ambo | H03M 1/129 327/94 |
| 2010/0219997 A1* | 9/2010 | Le Guillou | H03M 3/386 341/143 |
| 2011/0279159 A1 | 11/2011 | Lin | |
| 2012/0034875 A1* | 2/2012 | Moritsuka | H03F 3/195 455/63.1 |
| 2012/0068743 A1* | 3/2012 | Youssef | H03L 7/099 327/156 |
| 2012/0187988 A1* | 7/2012 | Aryanfar | G06F 1/10 327/156 |
| 2014/0176208 A1 | 6/2014 | Yamaguchi | |
| 2014/0266824 A1 | 9/2014 | Lowney et al. | |

OTHER PUBLICATIONS

Lin Zhang et al., *A 1V, 1mW, 4GHz Injection-Locked Oscillator for High-Performance Clocking*, Custom Integrated Circuits Conference, 2007, CICC, '07, IEEE, 978-1-4244-1623-3, 9 pages, including Abstract.

Firoj Kabir, *A General Guideline: How to Use the CDC5801 for Phase Alignment/Adjustment*, Application Report SCAA070B, Jan. 2004, Revised Oct. 2005, 10 pages.

EP Search Report issued in EP Patent Application Serial No. 17155011.4 dated Jul. 12, 2017, 12 pages.

Ehsan Zhian Tabasy et al., *A 6 bit 10 GS/s TI-SAR ADC With Low-Overhead Embedded FFE/DFE Equalization for Wireline Receiver Applications*, IEEE Journal of Solid-State Circuits, vol. 49, No. 11, Nov. 2014, 16 pages.

Luke Wang et al., *Time Interleaved C-2C SAR ADC with Background Timing Skew Calibration in 65 nm CMOS*, 978-1-4799-5696-8/14 © 2014 IEEE, 4 pages.

Tarek Zaki et al., *Design of a Quadrature Clock Conditioning Circuit in 90-nm CMOS Technology*, 2008 International Conference on Microelectronics, 4 pages.

Xiaochen Yang et al., *A 10 GS/s 6 b Time-Interleaved Partially Active Flash ADC*, IEEE Transactions on Circuits and Systems—I: Regular Papers, vol. 61, No. 8, Aug. 2014, 10 pages.

* cited by examiner

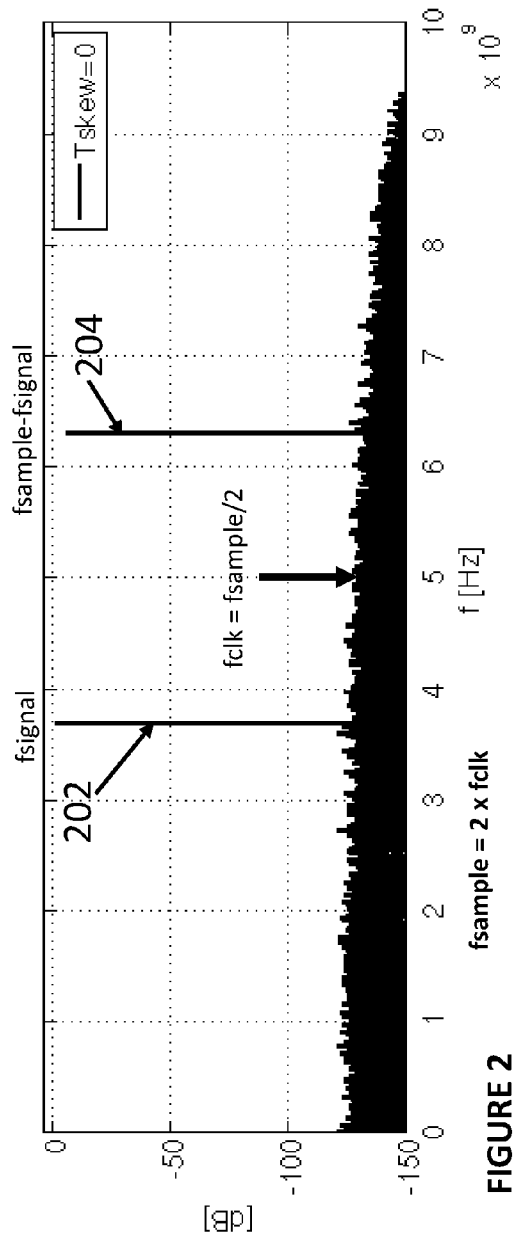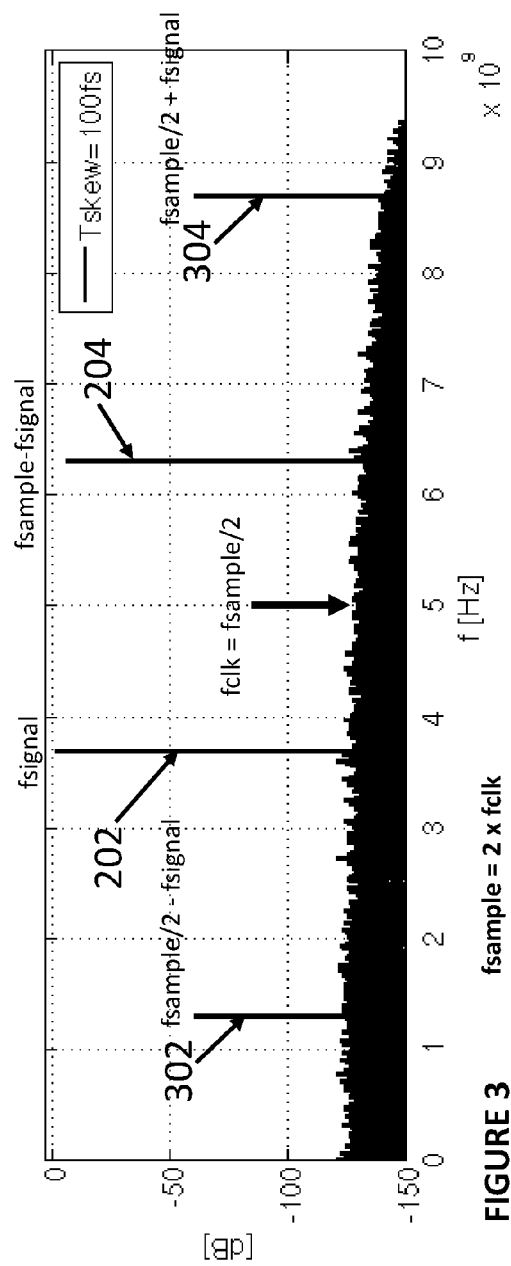
FIGURE 2
FIGURE 3

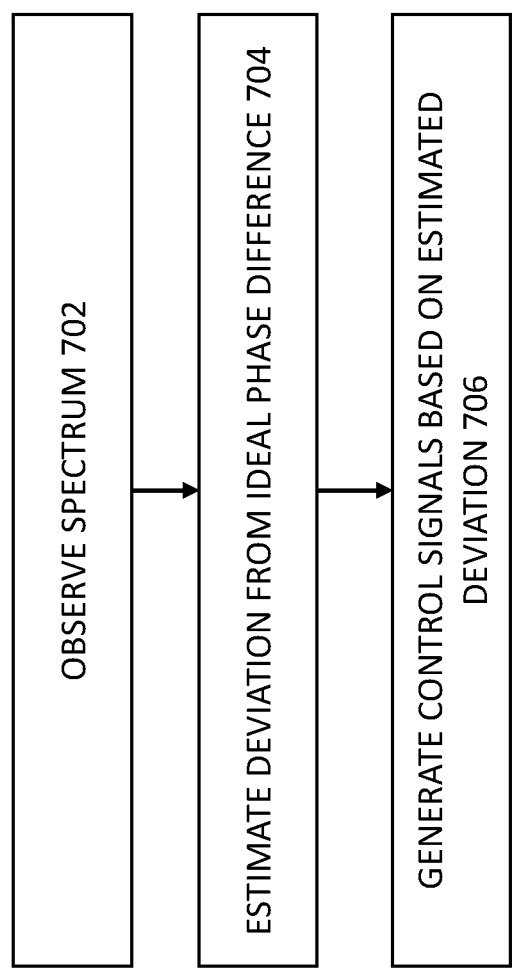

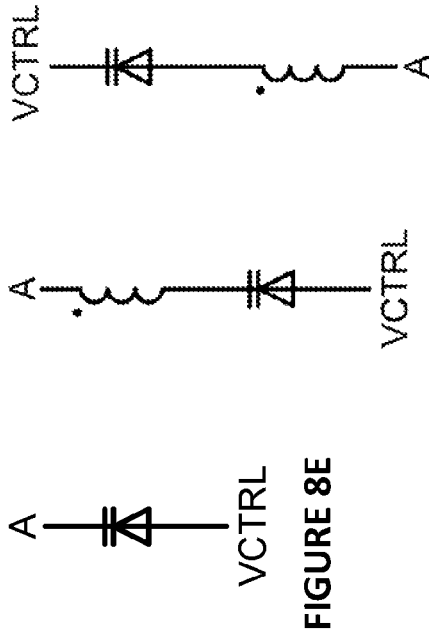
FIGURE 8A
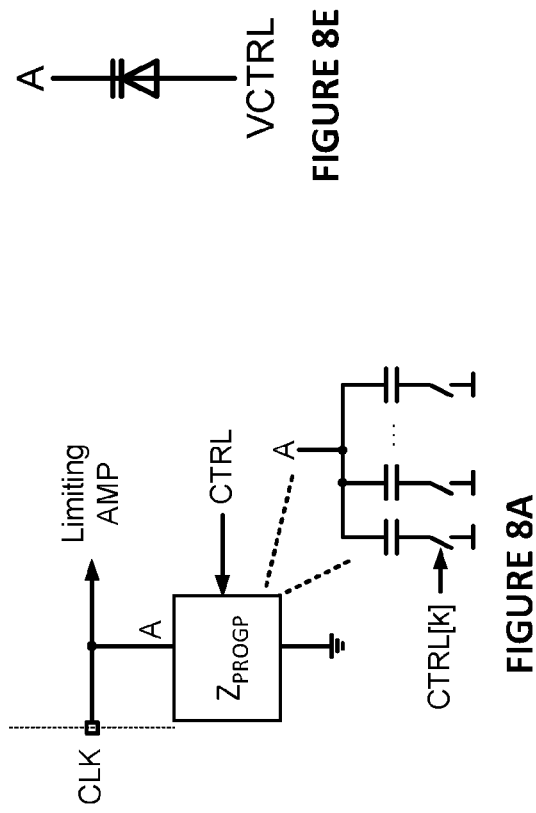
FIGURE 8B
FIGURE 8C
FIGURE 8D
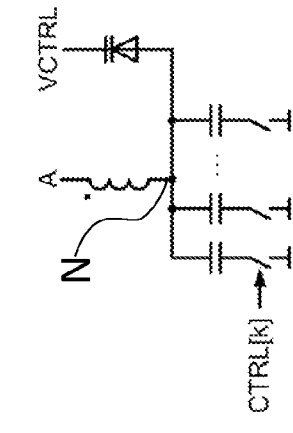
FIGURE 8E
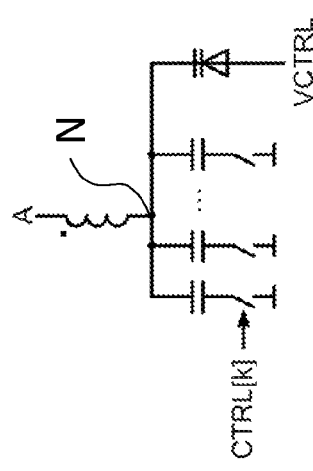
FIGURE 8F
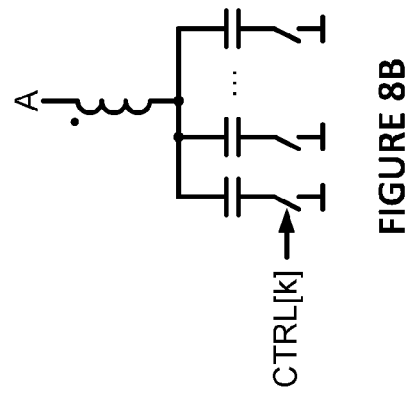
FIGURE 8G

DIFFERENTIAL PHASE ADJUSTMENT OF CLOCK INPUT SIGNALS

TECHNICAL FIELD OF THE DISCLOSURE

The present invention relates to the field of integrated circuits, in particular to adjusting phase of a differential clock input signals.

BACKGROUND

Integrated circuits processes electrical signals for rich electronic applications. Data converters are an important part of electronics, responsible for converting signals between the digital domain and the analog domain. However, circuits inside data converters or circuits driving the data converters are not perfect, and as a result, the conversion output may not be perfect. The imperfections can cause unwanted noise or spurs to appear at the output and degrade the performance of the data converter. If not removed or calibrated out, the noise or spurs can even affect other parts of the signal chain.

BRIEF SUMMARY OF THE DISCLOSURE

Differential clock phase imbalance can produce undesirable spurious content at a digital to analog converter output, or interleaving spurs on an analog-to-digital converter output spectrum, or more generally, in interleaving circuit architectures that depend on rising and falling edges of a differential input clock for triggering digital-to-analog conversion or analog-to-digital conversion. A differential phase adjustment approach measures for the phase imbalance and corrects the differential clock input signals used for generating clock signals which drive the digital-to-analog converter or the analog-to-digital converter. The approach can reduce or eliminate this phase imbalance, thereby reducing detrimental effects due to phase imbalance or differential clock skew.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 2 shows an exemplary ideal output spectrum of a 10 GSample/s double data rate digital-to-analog converter;

FIG. 3 shows an exemplary output spectrum of a 10 GSample/s double data rate digital-to-analog converter with 100 femtoseconds of timing skew;

FIG. 7 is a flow diagram illustrating a method for differential clock phase adjustment to reduce image spurs in an output of a data converter circuit, according to some embodiments of the disclosure; and FIGS. 8A-G illustrates possible circuit implementations of a controllable impedance block, according to some embodiments of the disclosure.

DESCRIPTION OF EXAMPLE EMBODIMENTS OF THE DISCLOSURE

Basics of Data Converters

Data converters, which includes analog-to-digital converters (ADCs) and digital-to-analog converters (DACs), are important to many signal chains. For example, ADCs translate analog quantities into digital language that digital circuits and processors can digitally process. ADCs are often used in information processing, communications or data transmission, control systems, and instrumentation. ADCs are used in transforming transmitted or stored data or the results of digital processing by digital circuits and processors back to analog quantities. ADCs can be used for control systems, display systems, communications or data transmission, and further analog processing. ADCs and DACs can be associated with many different performance metrics. Besides speed, resolution, linearity and so forth, ADCs and DACs can vary in the amount of noise, nonlinearity, and spurious tones present at the output. The amount of noise, linearity, and spurious tones can affect many dynamic performance metrics, such as spurious free dynamic range (SFDR).

Data Converters Sensitive to Phase Imbalance in the Clock Signals

Degradation in performance can sometimes be caused by imperfect clock signals which are driving the data converter. For example, differential phase imbalance present in a differential input clock, differential input clock signals, or pseudo-differential clock signals, or differential phase imbalance due to non-idealities of internal clock routing can lead to undesirable spurs appearing at a DAC output spectrum, an ADC output spectrum, or a spectrum of an ADC input receiving a DAC output. For instance, spurs appear in the output if both edges of a differential input clock are contributing to the conversion process, e.g. a sampling operation in a ping-pong (2× interleaved) ADC, or the update operation in a 2× interleaved DAC. Phrased differently, these spurs can appear in the output of a data converter comprising two (or more) interleaving/interleaved converters operating independently on either the rising edges or the falling edges of respective (single-ended) pseudo-differential clock signals. The output of the data converter is the combined output of the two (or more) interleaving/interleaved converters. The pseudo-differential clock signals, ideally 180 degrees out of phase, can be generated from differential input clock signals which are ideally 180 degrees out of phase.

Figure 1:
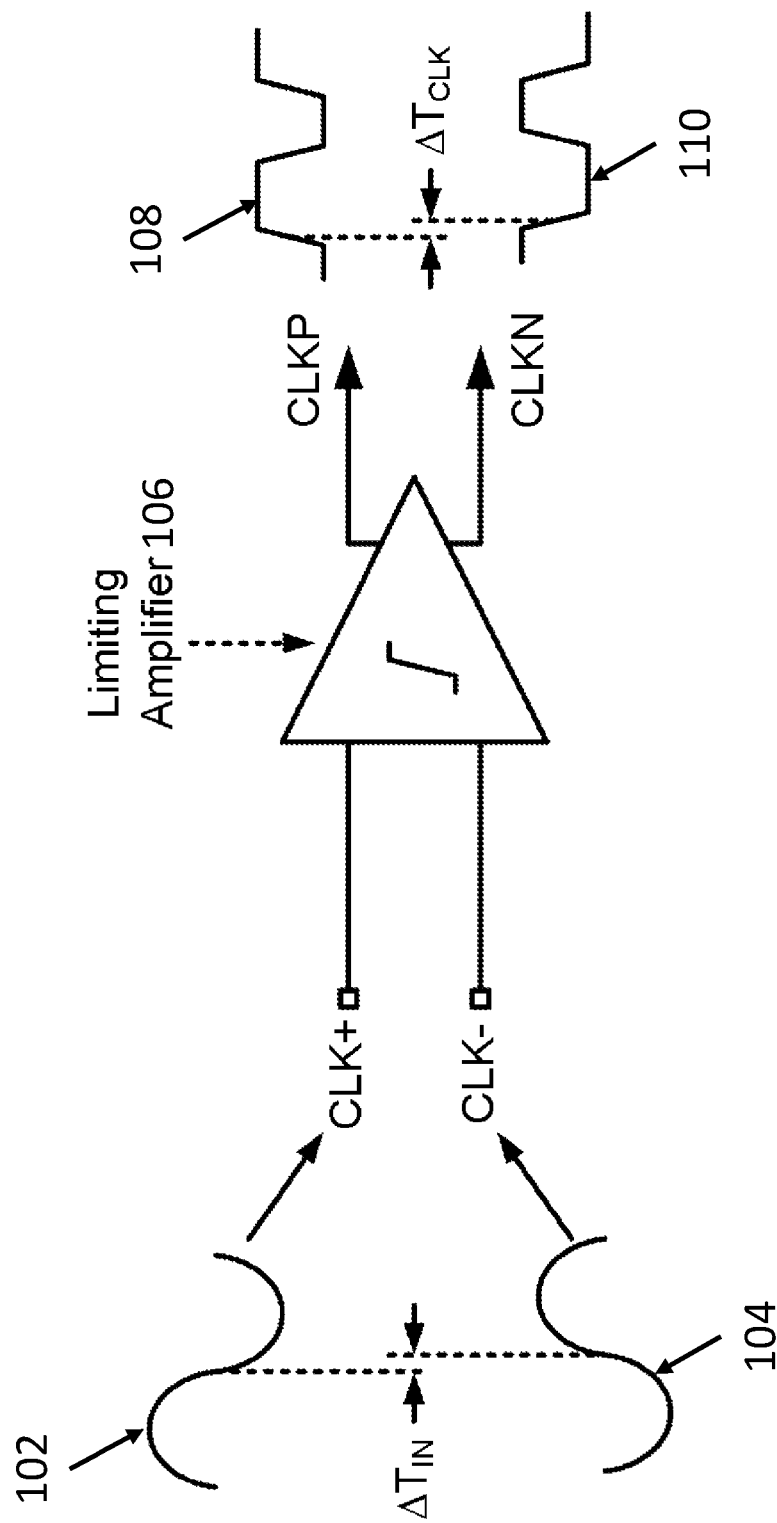
FIG. 1 illustrates phase imbalance present in the signals, according to some embodiments of the disclosure.

FIG. 1 illustrates phase imbalance present in the signals, according to some embodiments of the disclosure. Differential clock input signals 102 and 104 (having frequency fclk) is processed by an (on-chip) limiting amplifier 106 to generate pseudo-differential clock signals 108 and 110 (labeled as CLKP and CLKN), for driving or clocking a data converter. The waveforms of differential clock input signals 102 and 104 can be sine waves which are ideally 180 degrees out of phase with each other. The limiting amplifier 106 can generate pseudo-differential (complementary metal-oxide field effect transistor CMOS) clock signals 108 and 110 as output. The waveforms of the pseudo-differential clock signals 108 and 110 are ideally square waves, which are ideally 180 degrees out of phase with each other.

The pseudo-differential clock signals 108 and 110 clock some double data rate (DDR) DACs and time-interleaved or interleaving ADC systems (e.g., ping-pong ADCs). DDR DACs can update data on either the rising edges or the falling edges of pseudo-differential clock signals clocking the DDR DAC. Interleaved ADC systems, such as Ping-pong ADCs, can sample the input on either the rising edges or the falling edges of pseudo-differential clock signals clocking the ADCs in the interleaved ADC system. Since the data converter samples or updates on either the rising edges or the falling edges of pseudo-differential clock signals, fsample=2×fclk (sampling/updating frequency fsample is twice the frequency of the differential input clock signals fclk).

However, the differential input clock signals 102 and 104 can have phase imbalance, where the differential input clock signals 102 and 104 have a timing skew of $\Delta T_{IN}$ with respect to each other. In some cases, the differential input clock signals 102 and 104 are generated and provided by a (non-ideal) differential clock source, e.g., a balun, a transformer, or clock generator chip, and the signals 102 and 104 have a finite phase imbalance. The differential clock source generating the differential input clock signals 102 and 104 can be off-chip, and its output is coupled to terminals CLK+ and CLK−. The differential clock source generating the differential input clock signals 102 and 104 can be on-chip in some scenarios. For instance, the on-chip differential clock source can receive a single-ended sine wave from on-chip or off-chip, and generate the differential input clock signals 102 and 104. Although the limiting amplifier 106 may have some correction capability, the on-chip pseudo-differential clock signals 108 and 110 still has some finite phase mismatch, as shown by timing skew $\Delta T_{CLK}$. It can be seen from the figure that the pseudo-differential clock signals 108 and 110 generated from the differential input clock signals 102 and 104 are ideally 180 degrees out of phase but has a timing skew of $\Delta T_{CLK}$. Generally, the limiting amplifier 106 cannot correct or eliminate for all the timing skew $\Delta T_{CLK}$. Data converters sensitive to this residual phase imbalance in the differential clock signals 108 and 110 can experience performance deterioration. Even if the limiting amplifier 106 can eliminate the timing skew $\Delta T_{CLK}$, other sources of phase imbalance in a clock distribution network or in the data converter itself can cause performance to degrade.

Correcting timing skew is distinct from duty-cycle and cross-point control. In some applications, the correction capability of the limiting amplifier 106 (if any is provided in the limiting amplifier) can include duty-cycle and cross-point control, which in combination can correct some of the timing skew but cannot not correct for all of the timing skew. When the clock frequency increases, the problem associated with timing skew worsens. Furthermore, the problem associated with timing skew becomes more important when applications demands better SFDR. Even if the limiting amplifier corrects some of the timing skew, there may still be other sources of timing skew present in the circuit which cannot be corrected by the limiting amplifier, including timing skew added by an on-chip clock distribution network, or the data converter.

Spurs in the Output Spectrum

Data converters sensitive to phase imbalance in the clock signals include some DDR DACs and time-interleaved or interleaving ADCs (e.g., ping-pong ADCs), whose output signals depend on the phase of the clock signals driving such converters. The undesirable spurs can manifest itself as folded back images that are not perfectly suppressed. For instance, a slower rate input clock can be provided to the chip to clock a DDR DAC as a more power effective clocking solution. Such DDR DACs can be sensitive to the phase imbalance in the pseudo-differential clock signals driving DDR DAC. In some instances, some DDR DACs employ other power costly solutions such as entering the chip using a clock that is twice the frequency of the input clock fclk, or generating the 2×fclk clock on chip using a Phase-Locked Loop. Such clocking solutions can still have internal timing mismatches, which can lead to similar problems associated with timing skew.

To illustrate, FIG. 2 shows an exemplary ideal output spectrum of a 10 GSample/s double data rate digital-to-analog converter. Herein, fclk denotes the frequency of the differential input clock signals, fsample denotes actual sampling or update frequency of the data converter. The input signal, having an exemplary signal frequency fsignal, appears in the output spectrum of the DDR DAC as the fundamental tone 202 and its image 204 at fsignal and fsample-fsignal respectively in the output spectrum. FIG. 3 shows an exemplary output spectrum of a 10 GSsample/s double data rate digital-to-analog converter with 100 femtoseconds (fs) of timing skew. Similar to FIG. 2, the input signal, having an exemplary signal frequency fsignal, appears in the output spectrum of the converter as the fundamental tone 202 and its image 204 at fsignal and fsample-fsignal respectively in the output spectrum. Due to the interleaving aspect of the DDR DAC and timing skew (e.g., $\Delta T_{CLK}$ or Tskew=100 fs), the output spectrum has two additional, interleaving tones (i.e., undesirable image tones) 302 and 304, which appear at fsample/2+/−fsignal in the output spectrum. Similar interleaving tones can appear in the output of the time-interleaved ADCs. Unfortunately, data converter systems cannot rely on the limited capabilities of the limiting amplifier 106 of FIG. 1 to correct for phase imbalance or rely on any off-chip circuits to provide a better differential input clock signals 102 and 104 of FIG. 2.

Potential solutions to this problem are can be costly, inconvenient, or insufficient. Better off-chip components with less differential phase imbalance at very high frequencies tend to be very costly. While timing skew could be corrected off-chip by attaching selected off-chip impedances to the clock inputs to provide manual "tuning", such a solution is also very costly, since it has to done for each component individually and in-place, i.e., after fabrication and population of the printed circuit board, which is not at all mass-production friendly. Using a clock with only one critical edge means doubling the input clock rate (fsample=fclk) is also not very economical power-wise (as opposed to clocking on both the rising and falling edges of the differential input clock), if the desired sampling rate is sufficiently high.

Adjusting Both Differential Clock Input Signals to Reduce Phase Imbalance

To reduce phase imbalance, a differential clock phase adjustment circuit can utilize adjustable loads (e.g., tunable impedances) at the inputs to a component receiving the differential input clock signals (e.g., CLK+ and CLK− of FIG. 1) to deskew the incoming clock edges and compensate for the skew appearing at the data converter (e.g., DAC sample switches or interleaved the ADC slices), or any phase imbalance in the system. A circuit can be coupled to the output of the data converter (or other outputs in a subsequent/later part of the signal chain) to measure the amplitude of the undesired image in an output spectrum due to phase imbalance to provide feedback control of the skew adjustment. Since the circuit observes or measures errors directly at the converter output, the observation or measurements also captures any internal mismatch in the whole clock distribution and inside the data converter (which cannot be done by merely observing the differential input clock signals).

Figure 4:
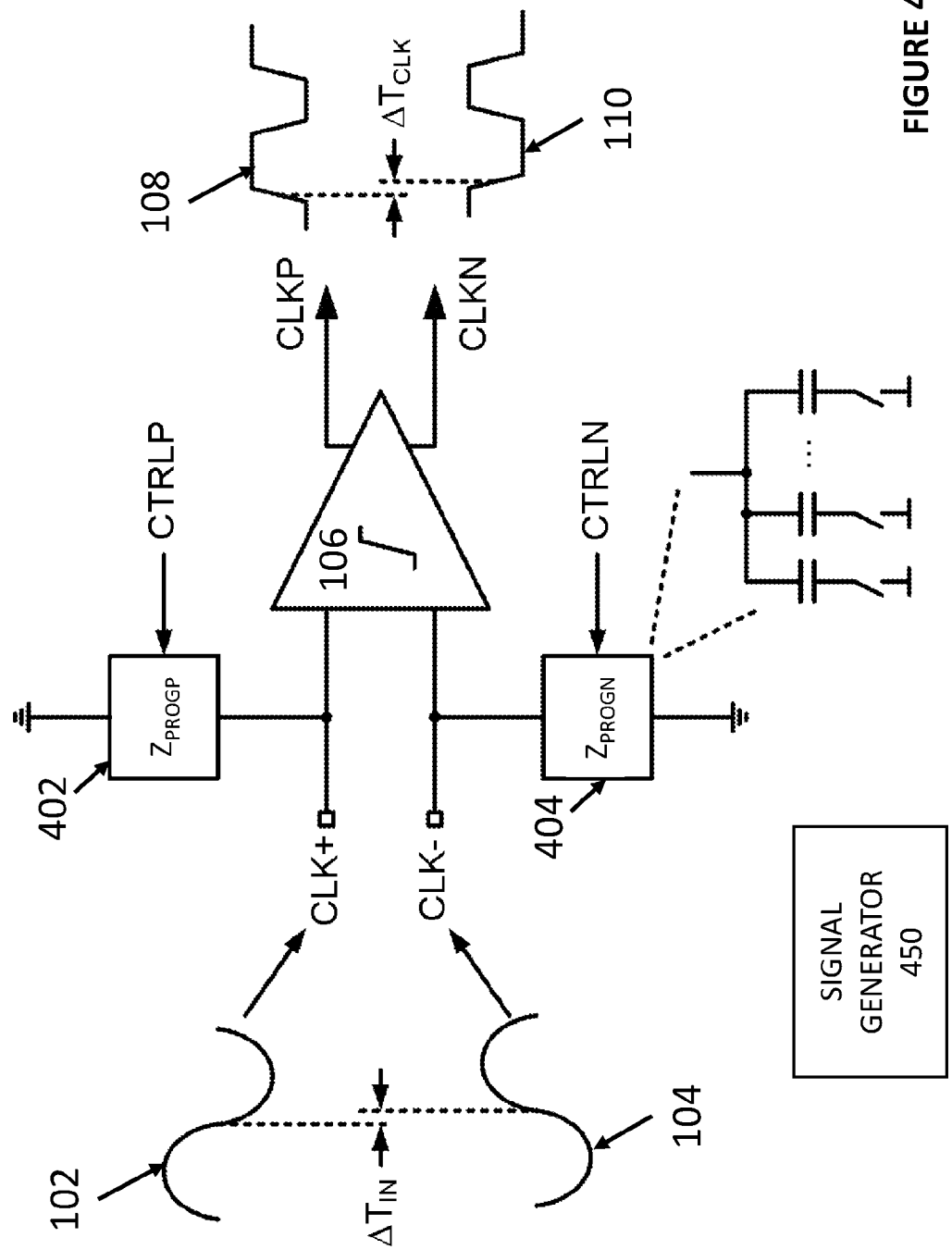
FIG. 4 illustrates a differential clock phase adjustment circuit, according to some embodiments of the disclosure.

FIG. 4 illustrates a differential clock phase adjustment circuit, according to some embodiments of the disclosure. The circuit can include a processing circuit for receiving the first and second differential clock input signals 102 and 104. In this example, the processing circuit is limiting amplifier 106 for processing the first and second differential clock input signals 102 and 104 to generate the first and second pseudo-differential clock signals 108 and 110. The processing circuit generates first and second pseudo-differential clock signals 108 and 110 (labeled as CLKP and CLKN). The first and second pseudo-differential clock signals 108 and 110 drives a data converter circuit (not shown in FIG. 4 but shown in FIGS. 5 and 6). The first and second pseudo-differential clock signals 108 and 104 are out of phase with respect to each other, and are preferably or ideally 180 degrees out pf phase with respect to each other. Some phase imbalance may be present, which is shown as timing skew $\Delta T_{CLK}$. The data converter may include comprises two interleaved converters operating independently on either the rising edges or the falling edges of the first and second pseudo-differential clock signals. Outputs of the two interleaved converters are combined as the output of the data converter.

As described previously, the first and second differential clock input signals 102 and 104 are out of phase with respect to each other, and are preferably or ideally 180 degrees out pf phase with respect to each other. Some phase imbalance may be present, which is shown as timing skew $\Delta T_{IN}$. Phase imbalance may also be present after the limiting amplifier, e.g., in the on-chip clock distribution network and even within the converter core itself. Generally speaking, phase imbalance on-chip can be far less than the phase imbalance associated with the timing skew of the differential clock input signals 102 and 104. However, such small phase imbalance remains a problem if the SFDR requirements demand better performance, and/or if the output frequency is high (since the problem scales linearly with the required output frequency). The present disclosure describes embodiments which can correct for these other phase imbalances in the system.

In some embodiments, a differential clock phase adjustment circuit for reducing image spurs in an output of a data converter circuit comprises several parts. The circuit can include adjustable loads, e.g., a first and second controllable impedance blocks 402 and 404 coupled to a first and second differential clock signal paths receiving (or carrying) a first and second differential clock input signals 102 and 104 respectively. The first and second differential clock signal paths are shown as paths having CLK+ and CLK− input nodes and coupled to inputs of the limiting amplifier 106. The differential clock phase adjustment circuit tunes adjustable loads, e.g., independently controllable impedances $Z_{PROGP}$ and $Z_{PROGN}$ coupled to CLK+ and CLK− respectively, to reduce the phase imbalance at the differential clock inputs CLK+ and CLK−. The adjustable loads can reduce the timing skew $\Delta T_{IN}$, the timing skew between differential input clock signals 102 and 104. A feedback mechanism can observe an output of a data converter driven or clocked by the clock signals 108 and 110 (labeled as CLKP and CLKN) and generate controls signals CTRLP and CTRLN to tune $Z_{PROGP}$ and $Z_{PROGN}$, respectively.

The adjustable loads, e.g., the first and second controllable impedance blocks 402 and 404, are shown as $Z_{PROGP}$ and $Z_{PROGN}$ respectively. The control signals CTRLP and CTRLN can control effective (complex) impedances of the first and second controllable impedance blocks 402 and 404 to deskew the first and second differential clock input signals 102 and 104. The phase of the circuit can be adjusted through the adjustable loads to reduce the phase imbalance. The control signals may be in analog form, digital form or a combination thereof. With pseudo-differential impedance tuning done by the first and second controllable impedance blocks $Z_{PROGP}$ and $Z_{PROGN}$, the phase imbalance can be reduced or nullified. By adjusting the effective load, the timing or phase of the differential input clock signals 102 and 104 can be adjusted to reduce undesirable spurs by reducing phase imbalance in the system, e.g., decreasing the timing skew $\Delta T_{IN}$. The differential clock phase adjustment scheme moves both differential clock inputs to bring them closer to the ideal phase difference.

The adjustable load can be implemented to provide various resolutions and skew adjustment ranges suitable for a particular application. In some embodiments, each one of the adjustable load is implemented with a bank of switched capacitors, a programmable capacitor bank, or a binary-scaled capacitor bank. Switched capacitor circuits are preferably used in the first and second controllable impedance blocks. Inductances are possible but not preferred due to the size of the inductors needed for some clock frequencies. However, for some applications where the clock frequency is sufficiently high, the on-chip inductance for implementing the controllable impedance blocks as part of an L-C series element can be reasonably small. Various implementations for the controllable impedance blocks are outlined in detail with respect to FIGS. 8A-G. In practice, the clock input nodes CLK+ and CLK− receiving a low noise sine wave as the differential clock input signals can be fairly sensitive. With relatively small impedances or reactive elements in the first and second controllable impedance blocks, a substantial influence can be made to the timing skew $\Delta T_{IN}$ between the differential clock input signals (especially given the clock frequency is fairly high for high speed data converters).

In some embodiments, the first and second controllable impedance blocks 402 and 404 comprises switched capacitor circuits having impedances tunable by the control signals CTRLP and CTRLN. The control signals CTRLP and CTRLN can control states of switches (e.g., transistors coupled to capacitors) in the first and second controllable impedance blocks 402 and 404 to switch capacitors in or out (individually) to tune the impedances of the first and second controllable impedance blocks 402 and 404. Preferably, the control signals can tune the phase component of the complex impedances of the controllable impedance blocks. If the differential clock inputs CLK+ and CLK− are driven by a component with a certain amount of resistance, adjusting the capacitances (e.g., by making the capacitances bigger on the first or second differential clock signal paths) can move the first order RC poles and time constants of the RC circuit so that the phase imbalance can be reduced or nullified.

Figure 5:
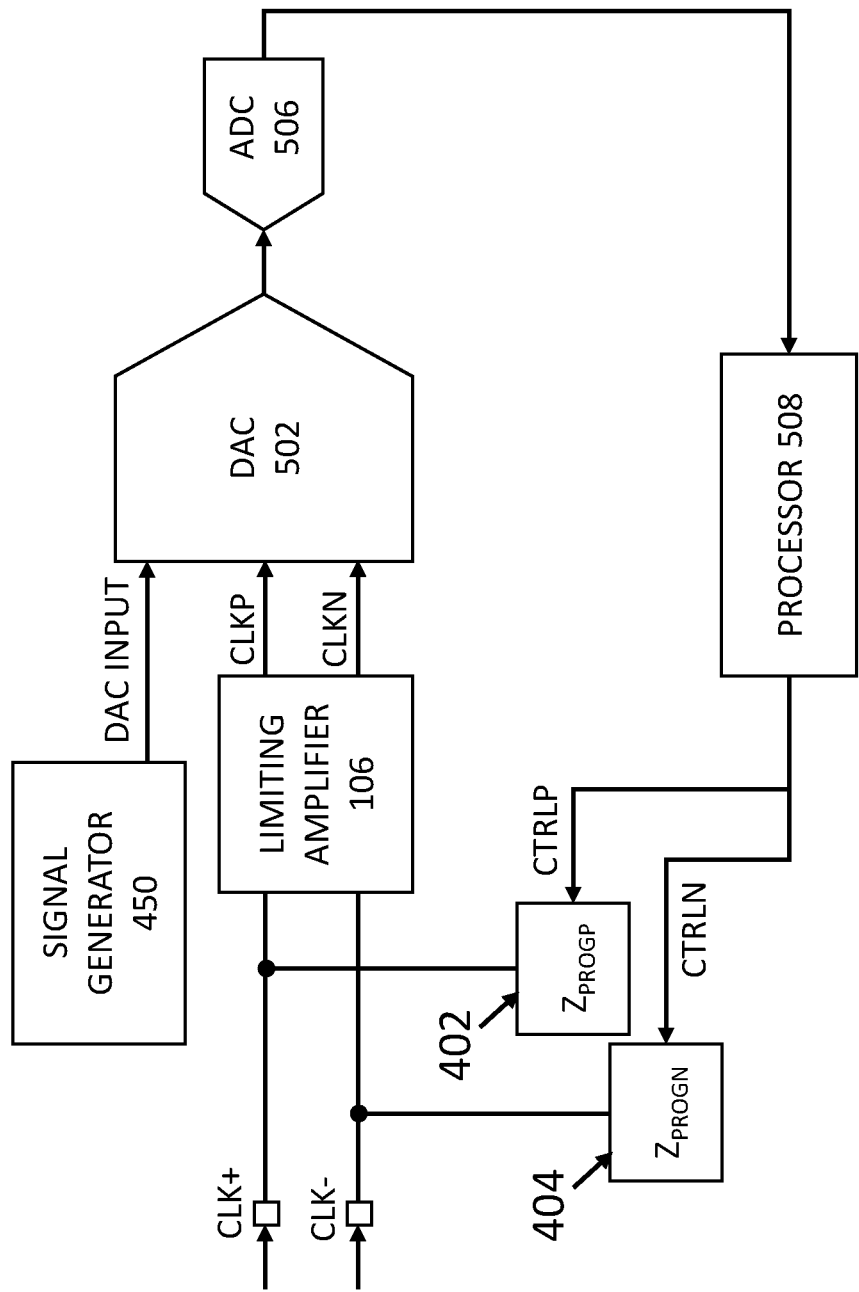
FIG. 5 illustrates a double data rate digital-to-analog converter with a differential clock phase adjustment circuit, according to some embodiments of the disclosure.
Figure 6:
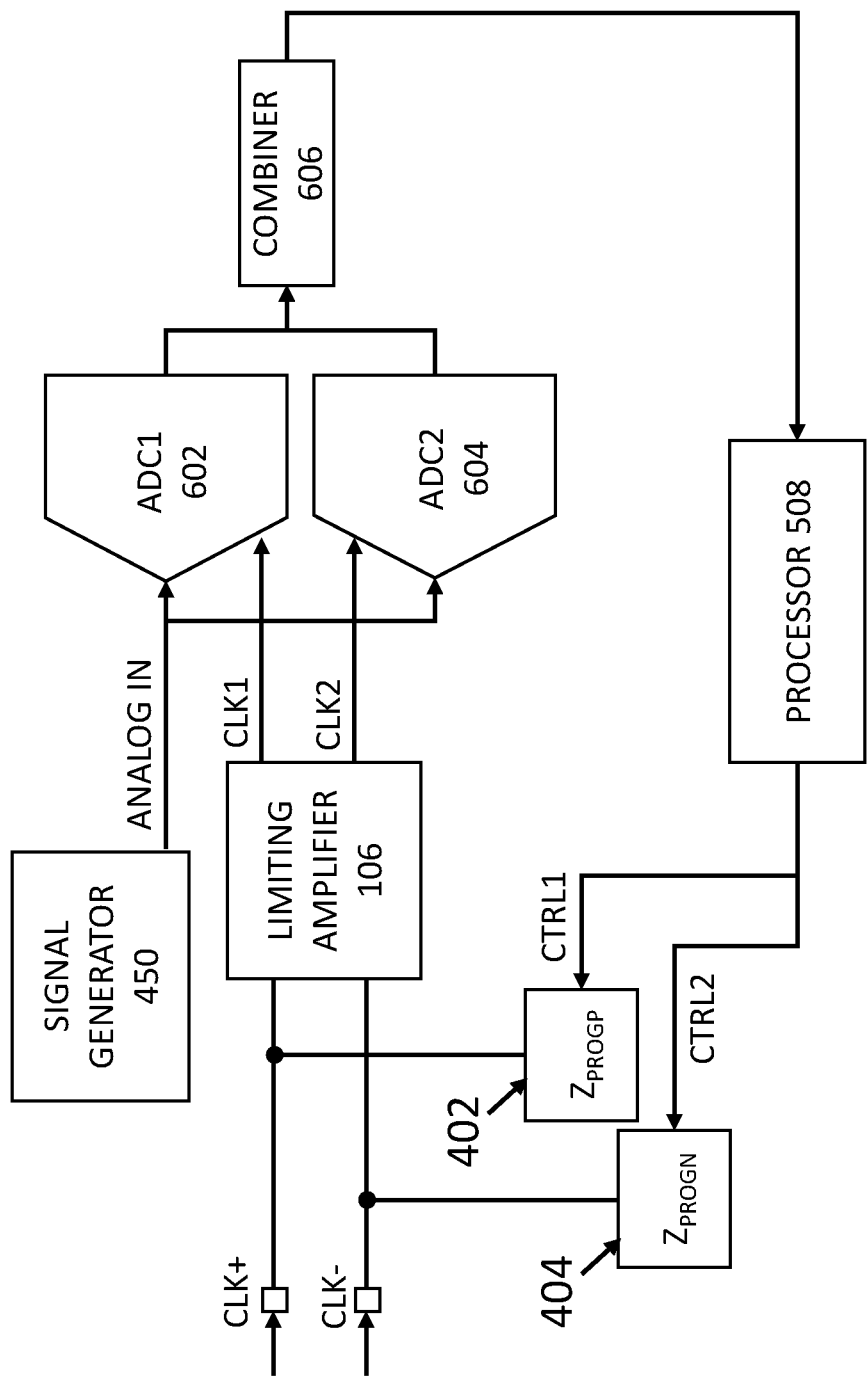
FIG. 6 illustrates a time-interleaved analog-to-digital converter with a differential clock phase adjustment circuit, according to some embodiments of the disclosure.

The circuit can include an observation path and a feedback control path (not shown in FIG. 4 but illustrated by FIGS. 5 and 6 and accompanying description).

The observation path observes at least an output of the data converter circuit, or at least a signal downstream from the data converter. Observing the output can allow the circuit to measure and locate undesirable spurs caused by phase imbalance, such that the clock phase can be adjusted accordingly. The observation path preferably includes an ADC and any suitable analog processing. By converting the observation into the digital domain, the controller can have arbitrary complexity or any complexity that suits the particular application needs.

The feedback control path generates the control signals (e.g., CTRLP and CTRLN to first and second controllable impedance blocks 402 and 404 respectively) to reduce phase imbalance of the first and second differential clock input signals 102 and 104 based on the observed output of the data converter circuit. The feedback control path can locate and/or measure an image spur caused by (at least) phase imbalance of the first and second differential clock signals and generates the control signals based on the located image spur. By reducing the phase imbalance in the system (e.g., phase imbalance of the first and second differential clock input signals 102 and 104 and any other phase imbalances present in the system), the timing skew $\Delta T_{CLK}$ of the first and second pseudo-differential clock signals 108 and 110 can also be reduced. As a result, the data converter or other circuits sensitive to this clock phase imbalance can suffer less performance degradation.

Different Modes of Calibration

Although not shown in FIG. 4 but shown in FIGS. 5 and 6, the circuit can optionally include a signal generator for generating a pilot tone as input to the data converter. The pilot tone is a known signal with a known ideal output spectrum at the output of the data converter. The pilot tone can be used (although not necessarily) in the foreground, while the data converter is not in use. Using a pilot tone, the observation path can observe the output of the data converter (i.e., observe the output spectrum) while the pilot tone is applied as the input to the data converter. If there is a phase imbalance, image spurs would appear at frequencies where there should not be an image (e.g., as illustrated by FIGS. 2 and 3) in addition to the peaks in energy or spectral power density corresponding to the input pilot tune. For example, the pilot tone can be a sine wave having a predetermined (fundamental) frequency, where the output spectrum is expected to have a peak at a frequency that corresponds to the predetermined (fundamental) frequency. If there is phase imbalance, undesirable image spurs can appear in the output spectrum at predetermined/known frequencies or frequency bands. By providing an appropriate receiver in the observation path (e.g., with appropriate frequency/bandwidth for the receiver for the pilot tone and frequency location of the expected undesirable image spurs), it is possible to observe the output spectrum at the frequencies or frequency bands of interest to infer the amount of timing skew or phase imbalance in the first and second differential clock input signals 102 and 104, and the first and second pseudo-differential clock signals 108 and 110. Providing a (digital) signal generator for the circuit usually does not incur additional area and cost, since many data converters already have internal sine generators for multiplying and moving a narrowband input signal to another part of the spectrum.

In some cases, the pilot tone can be added to the input of the data converter even during normal operation (i.e., background calibration), such that the clock phase adjustment circuit can operate in the background. Such pilot tone can be relative small in magnitude, and such a scheme can work if a receiver in the observation path is sensitive enough to sense any undesirable image spurs. In some background calibration scenarios, the frequency of the pilot tone can be chosen or selected to ensure the pilot tone itself as well as the expected undesirable image tones do not interfere with the normal processing of the application. Such a setup benefits from very fine or quasi-continuously phase tuning by the controllable impedance blocks since the tuning should be designed to not interfere with normal operation. In one example, coarse calibration can be performed at startup using a discrete capacitor bank (i.e., foreground calibration), and continuous fine control can be performed in the background using a pair of varactors for the controllable impedance blocks. The varactors can be controlled by a differential voltage output DAC with sufficiently fine resolution.

In an alternative to including and using a signal generator to generate a pilot tone while the data converter is not in use (e.g., during calibration mode, in the foreground, or in the background), the observation path and the feedback control path can operate in the background during normal operation of the data converter, if characteristics of the normal input signal (e.g., expected ideal output spectrum) to the data converter are known (or can be determined), and an appropriate receiver is provided in the observation path to sense any undesirable image spurs caused by phase imbalance.

In some cases, a signal generator 450 (of FIGS. 4-6) is preferably not included, or a designer may elect to not use a pilot tone, since some applications may require a high-quality analog sine wave to be generated. To measure and/or locate the image, the processor may receive information associated with the normal input signal itself, whose spectral positioning is often known in a particular application. In some full- or half-duplex systems, a sufficiently good enough DAC may be available for generating the high-quality analog sine wave as the pilot tone. Such pilot tone can be used for foreground calibration, and the information associated with the normal input signal itself can be used for background calibration without a pilot tone.

Differential Clock Phase Adjustment for DDR DACs

FIG. 5 illustrates a double data rate digital-to-analog converter (DDR DAC) with a differential clock phase adjustment circuit, according to some embodiments of the disclosure. The performance of the DDR DAC 502 can be severely affected by phase imbalance in the pseudo-differential clock signals CLKP and CLKN driving the DDR DAC 502 (as illustrated by FIGS. 2 and 3). When the DAC 502 is operated at double data rate, data can be updated at twice the input clock signal frequency (fsample=2×fclk), or phrased differently, on either the rising edges or the falling edges of the (single-ended) pseudo-differential differential clock signals CLKP and CLKN. For instance, some DDR DACs updates data at the rising edges of CLKP and the rising edges of the CLKN. Or, data is updated at the falling edges of CLKP and the falling edges of CLKN. Data is updated twice as fast as the differential clock, or one of the (single-ended) pseudo-differential clock signals (hence the DAC is a DDR DAC). Phrased differently, the DAC 502 operates as a 2× interleaved converter. If the pseudo-differential differential clock signals CLKP and CLKN are not aligned (i.e., not exactly 180 degrees out of phase), undesirable image spurs appear in the output spectrum of DAC 502. Other sources of timing skew can be present on-chip which can contribute to undesirable image spurs.

To observe the output of DAC 502, an observation path of the differential clock adjustment circuit can include an analog-to-digital converter 506 for receiving the output of the data converter (i.e., DDR DAC 502) and generating a digital output. In general, the analog-to-digital converter 506 may be a block within a receiver chain having other analog processing elements. The ADC 506 can possibly be used for observing or receiving signals for other purposes (e.g., digital predistortion, normal receiver chain). A feedback control path can include a processor 508 for observing frequency bands of interest of the digital output and estimating deviation from an ideal phase difference between of the first and second pseudo-differential clock signals based on spectral power density (or equivalent measurement, e.g., energy, or amplitude information) in the frequency bands of interest. For instance, unwanted image spurs can be measured and/or located to infer the deviation from the ideal phase difference (i.e., phase imbalance or timing skew). In some embodiments, the digital output can be stored in a buffer or memory, and the processor 508 can be provided on-chip or off-chip (e.g., on-chip or off-chip microprocessor or digital signals processing circuit) for accessing and analyzing the digital output. In some cases, the processor 508 can write to registers using the control signals CTRLP and CTRLN to tune the first and second controllable impedance blocks 402 and 404.

In some embodiments, a double data rate digital-to-analog converter system can include first and second signal paths (having clock input nodes CLK+ and CLK− and coupled to limiting amplifier 106) for receiving first and second differential clock input signals which are out of phase (e.g., ideally 180 degrees out of phase) and generated by an off-chip differential clock source, e.g., a balun, a transformer, etc. In some cases, the first and differential clock input signals are generated on-chip based on a single-ended sinewave provided by an off-chip or on-chip component.

The system includes first and second tunable circuits (e.g., a first and second controllable impedance blocks 402 and 404) coupled to the first and second signal paths respectively. The system includes a limiting amplifier 106 receiving the first and second differential clock input signals and generating first and second pseudo-differential clock signals (CLKP and CLKN) which are out of phase (e.g., ideally 180 degrees out of phase).

The system includes digital-to-analog converter circuitry (e.g., DDR DAC 502) whose data is updated at twice input clock signal frequency (e.g., fclk, the frequency of either one of the differential input clock signals), or phrased differently, on either the rising edges or the falling edges of the (single-ended) pseudo-differential clock signals CLKP and CLKN.

The system further includes differential clock input phase adjustment circuit for observing output of the double data rate digital-to-analog converter 502 to determine phase imbalance of the first and second pseudo-differential clock signals (CLKP and CLKN) and generating feedback control signals (CTRLP and CTRLN) to the first and second tunable circuits (e.g., a first and second controllable impedance blocks 402 and 404) to adjust phase of the first and second differential clock input signals (e.g., carried by the first and second signal paths to the input of the limiting amplifier 106) based on the determined phase imbalance.

In some embodiments, the differential clock input phase adjustment circuit measures an amplitude (or other equivalent measurement) of an image spur caused by the phase imbalance. The differential clock input phase adjustment circuit can include an analog-to-digital converter 506 for receiving the output of the digital-to-analog converter circuitry (e.g., DDR DAC 502) and generating a digital output, and a processor 508 for observing frequency bands of interest of the digital output and determining the phase imbalance based on spectral power density (or other equivalent measurement) in the frequency bands of interest.

Providing a differential clock phase adjustment circuit for a DAC can be particularly advantageous because it can be difficult to filter out the unwanted image spurs at the output of a DAC (i.e., which is generally broadcasting an analog signal), and such unwanted image spurs can significantly corrupt the outside environment. The performance degradation is worst when the unwanted image spurs falls in-band with the wanted signal content.

Differential Clock Phase Adjustment for Time-Interleaved ADCs

FIG. 6 illustrates a time-interleaved analog-to-digital converter with a differential clock phase adjustment circuit, according to some embodiments of the disclosure; and In an ADC the output digital spectrum is a direct measure of the skew imbalance. The performance of the time-interleaved ADC or interleaving ADC operating with clock signals which are not at an ideal phase difference from each other can also have undesirable spurs at its output. Other sources of timing skew can be present on-chip which can contribute to undesirable image spurs.

In this example, a two-way time-interleaved ADC is shown, which has two analog-to-digital converters (e.g., ADC1 602 and ADC2 604). ADC1 602 and ADC2 604 in the two-way time-interleaved ADC samples on either the rising edges or the falling edges of the first and second pseudo-differential clock signals (labeled as CLK1 and CLK2, generated by limiting amplifier 106, similar to CLKP and CLKN of other FIGURES). For instance, ADC1 602 and ADC2 604 samples the input signal at the rising edges of CLKP and the rising edges of the CLKN. Or, ADC1 602 and ADC2 604 samples at the falling edges of CLKP and the falling edges of CLKN. Sampling (i.e., sampling frequency fsample) occurs twice as fast as the differential input clock (i.e., frequency of the input clock fclk), or one of the (single-ended) pseudo-differential clock signals. The first and second pseudo-differential clock signals are 180 degrees out of phase for driving two ADCs, i.e., ADC1 602 and ADC2 604 (or "sub-ADCs").

Other time-interleaved ADCs may have two or more sub-ADCs therein. Such ADCs are still sensitive to phase imbalance if the clock signals driving the two or more sub-ADCs do not have the ideal phase alignment. For instance, a four-way time-interleaved ADC may suffer from performance degradation if four clock signals driving the sub-ADCs are not 90 degrees out of phase. The differential phase adjustment circuit described herein can also be applied to correct for such phase imbalances between two or more clock signals with ideal phase differences. Conventionally, some systems tries to align one or more clock signals to a reference clock signal (i.e., a single ended approach). The differential clock phase adjustment approach is distinct from the single ended approach because the tunable circuits can differentially shift the differential clock input signals to reduce the timing skew (as opposed to moving one single-ended clock signal closer to a reference clock signal). Moreover, the differential approach can be easier since single-ended approaches would generally compare each single-ended clock signal with a reference signal, which requires an additional signal as the reference. Furthermore, the overall observation and feedback control system can account for other sources of phase imbalance by observing the output of the data converter and not the clock signals themselves.

For an ADC, the digital output of the ADC is a direct observation of the output of the data converter. After the digital outputs of the two ADCs, ADC1 602 and ADC2 604, are combined by a combiner 606 (which places the digital data in a correct order). The observation path can observes a digital output of the data converter (i.e., output of the combiner 606), and the feedback control path comprising a processor can observe frequency bands of interest of the digital output and estimate deviation from an ideal phase difference between of the first and second pseudo-differential clock signals (e.g., CLK1 and CLK2) based on spectral power density (or other equivalent measurement) in the frequency bands of interest. For instance, the processor can measure the amplitude (of spectral power density, energy, or other equivalent measurement) of unwanted image spurs (representing the deviation from an ideal phase difference) and generate control signals CTRL1 and CTRL2 (similar to CTRLP and CTRLN of the other FIGURES) to tune the first and second controllable impedance blocks 402 and 404.

Method for Differential Clock Phase Adjustment

FIG. 7 is a flow diagram illustrating a method for differential clock phase adjustment to reduce image spurs in an output of a data converter circuit, according to some embodiments of the disclosure. The method includes observing the output of the data converter circuit, wherein the data converter circuit is driven by pseudo-differential clock signals having an ideal phase difference between each other (task 702). The pseudo-differential clock signals (e.g., first and second pseudo-differential clock signals 108 and 110 of the FIGURES) can be 180 degrees out of phase ideally, but in practice, can have femtoseconds or picoseconds of timing skew. The method further includes estimating deviation from the ideal phase difference based on the observed output (task 704). The observed output is generally an output spectrum, the energy of the output signal at various frequencies or frequency bands of interest, the spectral power density of the output signal at various frequencies or frequency bands of interest, or other equivalent measurements of the undesirable image spurs. If an image spur is found where an image spur is not expected to be, phase imbalance can be inferred. The method further includes generating control signals based on the estimated deviation to independently controllable circuit blocks (e.g., first and second controllable impedance blocks 402 and 404 of the FIGURES) coupled to corresponding signal paths of differential clock input signals (task 706). The differential clock input signals (e.g., first and second differential clock input signals 102 and 104 of the FIGURES) are used for generating the pseudo-differential clock signals to adjust phase of the differential clock input signals.

In some embodiments, the method can include varying impedance (or phase of the complex impedance) of the independently controllable circuit block based on the control signals. By varying the impedance, the time skew of the differential clock input signals can be reduced. For instance, the method can include varying capacitance of the independently controllable circuit block by controlling a bank of switchable capacitors in each independently controllable circuit block using the control signals. The feedback can be deterministic, where measurements made in the observed output representative of the phase imbalance maps directly to control signals suitable for reducing or nullifying the phase imbalance. The control feedback can also be adaptive or dynamic, where control signals can be adjusted to drive the measurements made in the observed output of the phase imbalance smaller and smaller until the phase imbalance is within an acceptable level. Phrased differently, generating the control signals can include changing the control signals to incrementally reduce the estimated deviation in a feedback control loop (e.g. with a least means squared algorithm or other suitable algorithm for measuring/driving the estimation deviation smaller and smaller).

In some embodiments, the method includes providing a pilot tone having a predetermined peak/spur in an output spectrum of the observed output while the output of the data converter circuit is being observed. A pilot tone can be used for either or both foreground calibration or background calibration, depending on the predetermined characteristics of the pilot tone and the normal input signal to the data converter circuit.

In some cases, the output of the data converter circuit is being observed during normal operation of the data converter (e.g., background calibration mode). In some cases, the output of the of the data converter circuit is being observed when the data converter is not in normal operation (e.g., foreground calibration mode).

In some embodiments, observing the output of the data converter comprises determining amount of energy, spectral power density (power is energy averaged over time), or amplitude information in one or more frequency bands of interest (e.g., observes the output spectrum). Estimating the deviation comprises measuring an unwanted image spur in the observed output. Generating the control signals comprises determining control signals corresponding to the measurement of the unwanted image spur. The control signals can actuate phase adjustment to reduce the measurement of unwanted image spur in the observed output spectrum.

Variations and Implementations

While many examples are described where clock signals are ideally 180 degrees out of phase with each other, this technique can be used where data converters are driven by two or more clock signals may have other ideal phase differences (e.g., 90 degrees out of phase). The differential clock adjustment approach schemes described herein can still correct for phase imbalances in such scenarios, if image spurs caused by the phase imbalance can be observed at the output of the data converter. Furthermore, this differential clock phase adjustment scheme is not to be confused with circuits which aim to align the phase of a signal with respect to a reference signal (i.e., single-ended trimming or adjustment) or duty cycle correction.

The observation path, in some embodiments, observes an output of the data converter circuit, and in some cases, the observation path can suitably observe other signals in a system (in a later part of the signal chain downstream from a data converter). For instance, a system may include an observation path for monitoring the output of an RF amplifier (PA) for digital predistortion (DPD). Sometimes the data converter (DAC in this case) may drive the PA directly (via a filter for anti-alias suppression), or may involve frequency translation (e.g., mixer), as well as some PA-driver stages (e.g., filtering). Depending on the system and signal frequencies involved and whether the image is still visible enough at the PA output, the DPD observation path can be used as the observation path described herein for locating/measuring the undesirable image tone. In some scenarios, the receiver chain in a duplex system may be used as observation path.

In some embodiments, the observation path may include further analog signal processing stages, e.g., mixer, gain stage(s), analog filter. These analog signal processing stages can be included between the data converter (such as a DDR DAC) and an ADC for observing the output of the data converter. In some applications, the location of the image tone is known and accordingly the observation path can be designed to specifically look at certain frequencies of interest to reduce the complexity of the observation path. For instance, a more economical observation path can include, e.g., a filter, mixer, filter and gain stage in front of a low-bandwidth ADC. In some cases, a very wideband ADC can be used (instead of providing the analog signal processing stages), but a wideband ADC can consume a lot of power. On the other hand, if the particular application may already be equipped with an ADC, the ADC can be used for the observation path if the ADC is suitable for locating/measuring the undesirable image tones. For instance, ADC(s) may be available in a duplex system on the receiver side and/or the transmit side.

FIGS. 8A-G illustrates possible circuit implementations of a controllable impedance block, according to some embodiments of the disclosure. Any one illustration or a suitable combination of two or more of the described illustrations can be implemented for the controllable impedance block depending on the application.

FIG. 8A shows a bank of capacitors (or a bank of switched capacitors) as the controllable impedance block having respective switches for grounding the capacitors. The switches can be closed or open to switch capacitors in or out to tune the impedance of the block.

FIG. 8B shows an alternative implementation of the controllable impedance block having an L-C series circuit. An inductor is in series with the bank of switched capacitors. Using grounded switches, a bank of switched capacitances in series with the inductance can be programmed to adjust the impedance of the block. The programmability can be done primarily be via the C (e.g., bank of capacitors with grounded switches). In some embodiments, the controllable impedance block may have a number of L-C series circuits (an inductor in series with a bank of switched capacitors with grounded switches connected to each clock input) corresponding to different input clock frequency ranges of interest. The different L-C series circuits can be optimized for specific frequency ranges.

FIGS. 8C-D show other implementations of the controllable impedance block comprising an inductor, a bank of switched capacitors in series with the inductor, and a varactor (along with a voltage controlled DAC, not shown). FIGS. 8E-G show other implementations of the controllable impedance block comprising (on-chip or off-chip) varactors. Generally speaking, varactors can allow a much finer control than a discrete set of fixed capacitors (i.e., the bank of capacitors described herein with grounded switches). Accordingly, varactors may be a more suitable candidate for background calibration for timing skew since varactors serve as a fine actuator to change the timing skew slowly. Smaller changes in tuning can be preferred over bigger jumps/changes. A varactor is controlled or driven by an analog control signal VCTRL, which can be generated by a (low-speed) voltage output DAC. The varactor can be on-chip or off-chip. In some alternative embodiments, the varactors (e.g., high quality discrete RF-varactors) are provided off-chip (instead of on-chip, e.g., circuit component with a control input for varying capacitance substantially continuously or over many fine steps). For FIGS. 5C-D, the bank of switched capacitors are connected to the inductor at node N, the varactor is connected to node N as well (but in different polarities for FIG. 8C versus 8D). Accordingly, the varactor is also in series with the inductor. The polarity of the varactor can depend on the DC potential at the clock input receiving the differential input clock signals. FIG. 8E shows an implementation including a varactor. FIGS. 8F-G shows an inductor in series with a varactor, but in different polarities for the two FIGURES. The polarity of the varactor can depend on the DC potential at the clock input receiving the differential input clock signals.

Discrete controllable impedance blocks can then be actuated by digital bits (i.e., control signal bits) generated by the feedback control path, while some the controllable impedance block can be actuated by an analog signal. In certain cases, if the controllable impedance blocks include at least one varactor, an additional DAC can be included in the feedback control path to convert a digital quantity computed by a processor to an analog quantity to control the impedance and effectively reduce timing skew. The additional DAC does not need to be perfect, if the processor can take imperfections such as non-monotonicity into account when generating the digital quantity.

Note that the activities discussed above with reference to the FIGURES are applicable to integrated circuits that can be sensitive to phase imbalance, e.g., the DDR DACs or time-interleaved ADCs described herein (where fsample=2× fclk and the differential clock can be provided by an off-chip component).

In certain contexts, the features discussed herein can be applicable to medical systems, scientific instrumentation, wireless and wired communications, radar, industrial process control, audio and video equipment, current sensing, instrumentation (which can be highly precise), cable infrastructure, military (e.g., Radar), and other systems where reducing image spurs at the output of a data converter is important to the application.

In the discussions of the embodiments above, any capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure. For instance, the controllable impedance blocks can be replaced by other circuits which can differentially adjust the timing of the differential input clock signals. One example includes the use of starved inverters in the signal path.

Parts of various apparatuses for differential clock phase adjustment can include electronic circuitry to perform the functions described herein. In some cases, one or more parts of the apparatus (e.g., processor 508 in the FIGURES) can be provided by a processor or digital signal processing circuit specially configured for carrying out the functions described herein. For instance, the processor 508 may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer medium.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the differential clock phase adjustment functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to differential clock phase adjustment, illustrate only some of the possible differential clock phase adjustment functions that may be executed by, or within, systems illustrated in the FIGURES. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

What is claimed is:

1. A method for differential clock phase adjustment to reduce image spurs in an output of a data converter circuit, the method comprising:
   observing the output of the data converter circuit, wherein the data converter circuit is driven by pseudo-differential clock signals having an ideal phase difference between each other;
   estimating deviation from the ideal phase difference based on the observed output;
   generating first and second control signals based on the estimated deviation to control first and second independently controllable circuit blocks respectively, wherein the first and second independently controllable circuit blocks are coupled to first and second parallel signal paths respectively, carrying first and second parallel differential clock input signals; and
   reducing, by the first and second independently controllable circuit blocks, timing skew between the first and second parallel differential clock input signals, wherein the first and second parallel differential clock input signals are used for generating the pseudo-differential clock signals.

2. The method of claim 1, further comprising:
   varying impedances of the first and second independently controllable circuit blocks based on the first and second control signals.

3. The method of claim 1, further comprising:
   varying capacitances of the first and second independently controllable circuit blocks by controlling a bank of switched capacitors in each independently controllable circuit block using the first and second control signals.

4. The method of claim 1, further comprising:
   providing a pilot tone having a predetermined peak in an output spectrum of the observed output while the output of the data converter circuit is being observed.

5. The method of claim 1, wherein the output of the data converter circuit is being observed during normal operation of the data converter circuit.

6. The method of claim 1, wherein:
observing the output of the data converter circuit comprises determining amount of energy in one or more frequency bands of interest;
estimating the deviation comprises measuring an unwanted image spur in the observed output; and
generating the first and second control signals comprises determining the first and second control signals corresponding to the measurement of the unwanted image spur.

7. The method of claim 1, wherein:
generating the first and second control signals comprises changing the first and second control signals to incrementally reduce the estimated deviation in a feedback control loop.

8. A differential clock phase adjustment circuit for reducing image spurs in an output of a data converter circuit, the differential clock phase adjustment circuit comprising:
a first and second controllable impedance blocks coupled to a first and second parallel differential clock signal paths respectively, said first and second parallel differential clock signal paths carrying a first and second parallel differential clock input signals respectively, wherein the first and second parallel differential clock input signals are out of phase with respect to each other;
a processing circuit for receiving the first and second parallel differential clock input signals and generating first and second pseudo-differential clock signals driving the data converter circuit, wherein the first and second pseudo-differential clock signals are out of phase with respect to each other;
an observation path for observing an output of the data converter circuit; and
a feedback control path for providing first and second control signals to the first and second controllable impedance blocks respectively to decrease timing skew between the first and second parallel differential clock input signals being carried by the first and second parallel differential clock signal paths respectively based on the observed output of the data converter circuit.

9. The differential clock phase adjustment circuit of claim 8, wherein the first and second controllable impedance blocks comprises switched capacitor circuits having impedances independently tunable by the first and second control signals respectively.

10. The differential clock phase adjustment circuit of claim 8, wherein the first and second control signals independently control effective impedances of the first and second controllable impedance blocks respectively.

11. The differential clock phase adjustment circuit of claim 8, wherein the processing circuit is a limiting amplifier for processing the first and second parallel differential clock input signals to generate the first and second pseudo-differential clock signals.

12. The differential clock phase adjustment circuit of claim 8, wherein:
the data converter circuit comprises two interleaved converters operating independently on either rising edges or falling edges of the first and second pseudo-differential clock signals; and
outputs of the two interleaved converters are combined as the output of the data converter circuit.

13. The differential clock phase adjustment circuit of claim 8, wherein:
the data converter circuit is a double data rate digital-to-analog converter whose data is updated on either rising edges or falling edges of the first and second pseudo-differential clock signals.

14. The differential clock phase adjustment circuit of claim 8, wherein:
the observation path comprises an analog-to-digital converter for receiving the output of the data converter circuit and generating a digital output; and
the feedback control path comprises a processor for observing frequency bands of interest of the digital output and estimating deviation from an ideal phase difference between of the first and second pseudo-differential clock signals based on spectral power density of the frequency bands of interest.

15. The differential clock phase adjustment circuit of claim 8, wherein:
the data converter circuit comprises time-interleaved analog-to-digital converters which each samples on either rising edges or falling edges of the first and second pseudo-differential clock signals.

16. The differential clock phase adjustment circuit of claim 8, wherein:
the observation path observes a digital output of the data converter circuit; and
the feedback control path comprises a processor for observing frequency bands of interest of the digital output and estimating deviation from an ideal phase difference between of the first and second pseudo-differential clock signals based on spectral power density of the frequency bands of interest.

17. The differential clock phase adjustment circuit of claim 8, further comprising:
a signal generator for generating a pilot tone as input to the data converter circuit;
wherein the observation path observes the output of the data converter circuit while the pilot tone is applied as the input to the data converter circuit.

18. A double data rate digital-to-analog converter system comprising:
first and second signal paths for receiving first and second differential clock input signals which are out of phase and generated by an off-chip differential clock source;
first and second tunable circuits coupled to the first and second signal paths respectively;
a limiting amplifier receiving the first and second differential clock input signals and generating first and second pseudo-differential clock signals which are out of phase;
digital-to-analog converter circuitry whose data is updated on either the rising edges or the falling edges of the first and second pseudo-differential clock signals; and
differential clock input phase adjustment circuit for observing output of the double data rate digital-to-analog converter system to determine phase imbalance of the first and second pseudo-differential clock signals and generating feedback control signals to the first and second tunable circuits to adjust respective phases of the first and second differential clock input signals based on the determined phase imbalance.

19. The double data rate digital-to-analog converter system of claim 18, wherein the differential clock input phase adjustment circuit measures an amplitude of an image spur caused by the phase imbalance.

20. The double data rate digital-to-analog converter system of claim 18, wherein the differential clock input phase adjustment circuit comprises:
   an analog-to-digital converter for receiving the output of the digital-to-analog converter circuitry and generating a digital output; and
   a processor for observing frequency bands of interest of the digital output and determining the phase imbalance based on spectral power density in the frequency bands of interest.

* * * * *